United States Patent
Huang et al.

(10) Patent No.: US 6,221,746 B1
(45) Date of Patent: Apr. 24, 2001

(54) METHOD FOR FORMING A POLY GATE STRUCTURE

(75) Inventors: Michael WC Huang; Tri-Rung Yew, both of Hsin-Chu (TW)

(73) Assignee: United Microelectronics Corp., Hsin-Chu (TW)

(*) Notice: Subject to any disclaimer, the term of this patent is extended or adjusted under 35 U.S.C. 154(b) by 0 days.

(21) Appl. No.: 09/223,010

(22) Filed: Dec. 30, 1998

(51) Int. Cl.[7] .................. H01L 21/4763; H01L 21/3205
(52) U.S. Cl. .................. 438/592; 438/305; 438/586; 437/200
(58) Field of Search .................. 438/592, 300, 438/304, 586, 595, 276, 305, 721; 437/69, 70, 72, 41, 192, 193, 200

(56) References Cited

U.S. PATENT DOCUMENTS

| | | | |
|---|---|---|---|
| 5,612,249 | * | 3/1997 | Sun et al. .................. 437/69 |
| 5,672,544 | * | 9/1997 | Pan .................. 437/200 |
| 5,902,125 | * | 5/1999 | Wu .................. 438/300 |
| 5,998,286 | * | 12/1999 | Chen et al. .................. 438/586 |

* cited by examiner

Primary Examiner—David Nelms
Assistant Examiner—Phuc T. Dang
(74) Attorney, Agent, or Firm—Bacon & Thomas, PLLC

(57) ABSTRACT

A method for forming a poly gate structure is disclosed. The method comprises forming a dielectric layer on a substrate and then forming a polysilicon layer on the dielectric layer. A metal silicide layer is then formed on the polysilicon layer and, just after formation of metal silicide is accomplished completely, an annealing process is practiced to induce phase transformation of metal silicide layer. Afterwards, a passivation layer is formed over the metal silicide layer, and then a standard photolithography method is applied to form primary structure of poly gate. Finally, both gate etch anneal and sidewall rapid thermal oxidation are used to form the poly gate structure completely. The essential point of the method is that the metal silicide is annealed just when it is formed, such that there is no phase transition of metal silicide will occur while any further treatment of the poly gate. By the way, surface extrusion of poly gate is fundamental prevented.

16 Claims, 5 Drawing Sheets

METHOD FOR FORMING A POLY GATE STRUCTURE

BACKGROUND OF THE INVENTION

1. Field of the Invention

The present invention relates to poly gate fabrication, and more particularly to a method for forming the metal silicide layer within poly gate.

2. Description of the Prior Art

Polysilicon is generally used to form the conductive part of metal-oxide-semiconductor (MOS), but the resistance value of polysilicon is too high to use even it is doped with impurity. Therefore, metal silicide is generally formed on polysilicon and used to decrease the resistance value of conductive part of MOS and then the operation of gate is improved. In addition, if there is any thermal processes in the following process of gate fabrication, phase transformation of the metal silicide may occur and the structure of gate is changed. No matter how, the ratio of metal to silicon is variable, which depends on the chemical reaction and the chamber condition, etc. Thus, the phase transformation temperature is sensitive depending on the ratio of metal to silicon.

The known process of poly gate formation comprises following steps. First, as shown in FIG. 1A, forming a dielectric layer 110 over a substrate and then forming a polysilicon layer 112 on dielectric layer 110. A metal silicide layer 114 is then formed on the polysilicon layer 112, where the popular metal silicide is tungsten silicide. Afterwards, as shown in FIG. 1B, a passivation layer 120 is capped over the metal silicide layer 112, since the capping process is a high temperature process so the structure of metal silicide is transformed to a new metal silicide structure 116. Furthermore, an anti-reflection layer 118 could be formed over metal silicide layer 116 before forming the passivation layer 120. Subsequently, conventional standard photolithography method is used to form the primary structure of poly gate as FIG. 1C shows. After the etching process is over, gate etch anneal process is used to restore the etching damage on the surface and sidewall oxide 124 is formed on the sidewall to protect the poly gate as shown in FIG. 1D. It is obvious that because both gate etch anneal and sidewall oxide formation are high temperature process, the structure of metal silicide 116 maybe change during these process and another metal silicide structure 122 is formed. The metal silicide structure 122 replaces the previous metal silicide structure 116 and induces peaks, dips and nodules on the surface of poly gate. In other words, the surface of poly gate is roughened and those extrusions often cause some disadvantages. For example, when a poly gate is close to other gate then these extrusions in different poly gate maybe is too close so current is conducted from one poly gate to another poly gate, this is so-called gate to gate short.

By the way, it is necessary to improve the fabrication of poly gate such that these extrusions vanish and the structure of metal silicide layer is stationary during any following treatment of poly gate.

SUMMARY OF THE INVENTION

In accordance with the present invention, a method for forming a poly gate structure is provided. The method substantially improves the problem that structure of metal silicide is varied during the fabrication of poly gate and then the surface of poly gate is roughened by metal silicide extrusion, which induces some disadvantages, for instance the gate to gate short. Furthermore, the provided invention requires no any special process and is feasible to perform with these widespread used processes of semiconductor device fabrication.

In one embodiment, the method is used to form a poly gate structure in a semiconductor substrate. The provided method comprises following steps. First, a dielectric layer is formed over a substrate and then a polysilicon layer is formed over the dielectric layer. Second, a metal silicide layer is formed on the polysilicon layer, and just after it is formed entirely, the metal silicide layer is annealed such that the structure of metal silicide layer is totally phase transformed. Where both the annealing temperature and the annealing time are strongly dependent on the fabrication of poly gate, and are adjusted to let the final annealed structure of metal silicide layer is fixed during any further treatment of poly gate. Afterwards, a passivation layer is formed over the annealed metal silicide layer, and then a photoresist layer is used to define the gate region over the passivation layer. Thus, anisotropically etching process is used to form the primly structure of poly gate. Finally, the photoresist layer is removed, an annealing process is used to repair the etching scars on the surface of poly gate and sidewall oxide is formed on sidewall of poly gate to protect it. The key point of the invention is that after metal silicide layer is formed, an annealing process is used to anneal it before any following fabrication of poly gate. The original structure of metal silicide layer is then transformed to the most stable structure and no phase transformation of metal silicide layer will be occur in following fabrication of poly gate.

In another embodiment according to the present invention, a poly sate structure of a dynamic random access memory (DRAM) is formed by the provided method. The chiefly details of the embodiment are similar to the previous embodiment except some difference. First, the substrate includes a dynamic random access memory and the poly gate is used to provide the gate of metal-oxide-semiconductor of DRAM. Second, the dielectric layer is a silicon oxide layer and the metal silicide layer is a tungsten silicide layer. Third, the annealing process completely changes the structure of tungsten silicide layer from hexagonal structure to tetragonal structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Referring to FIG. 2A to FIG. 2E, various stages in the fabrication of a poly gate of the invention is present. It is obvious that the mainly character of the invention is preannealing of the metal silicide layer 14, and the particularly result is the surface of final poly gate structure is smooth.

Figure 1A:
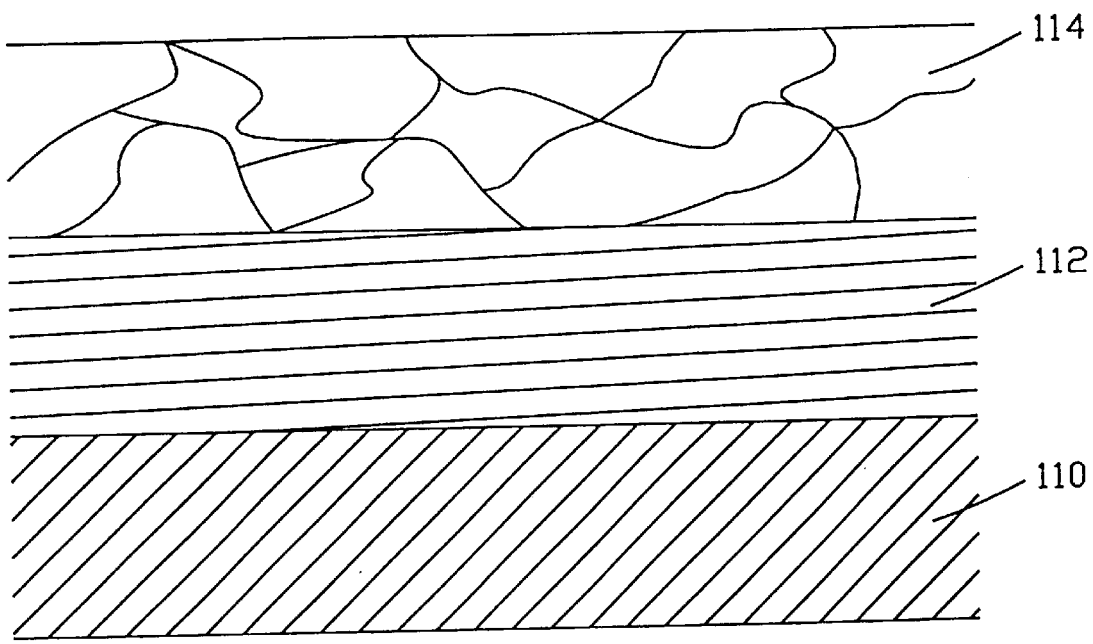
FIG. 1A to FIG. 1D show cross-sectional views illustrative of various stages in the fabrication of an poly gate with the known fabrication.
Figure 1B:
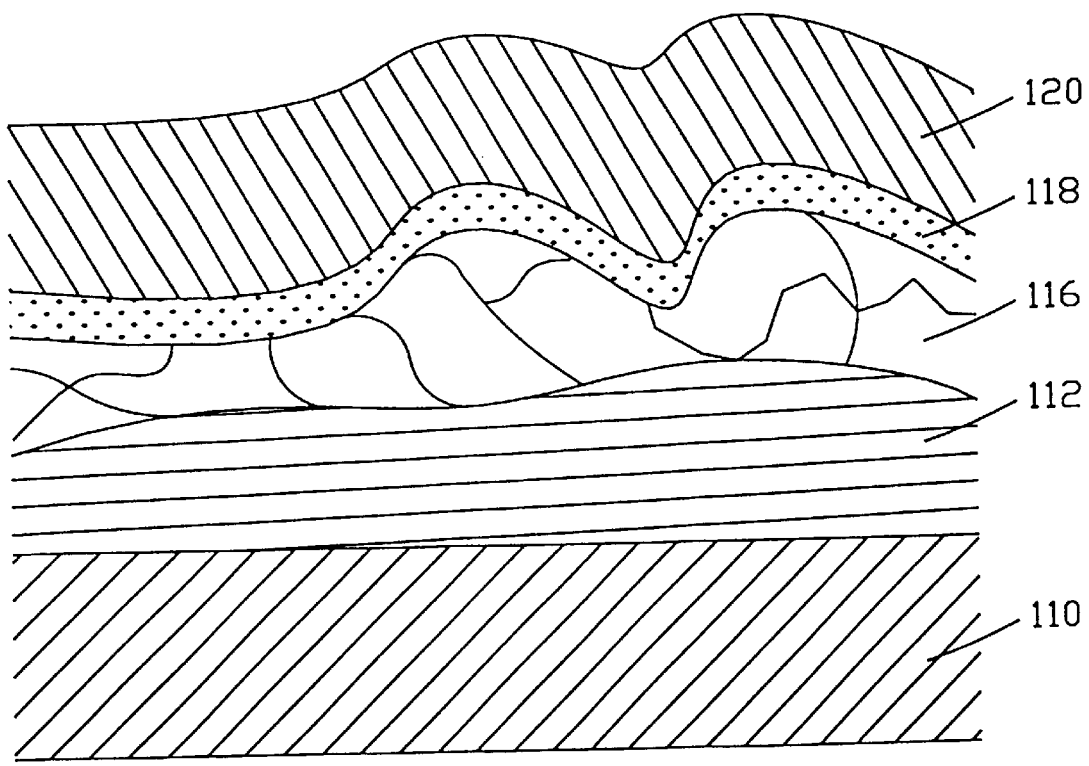
Figure 1C:
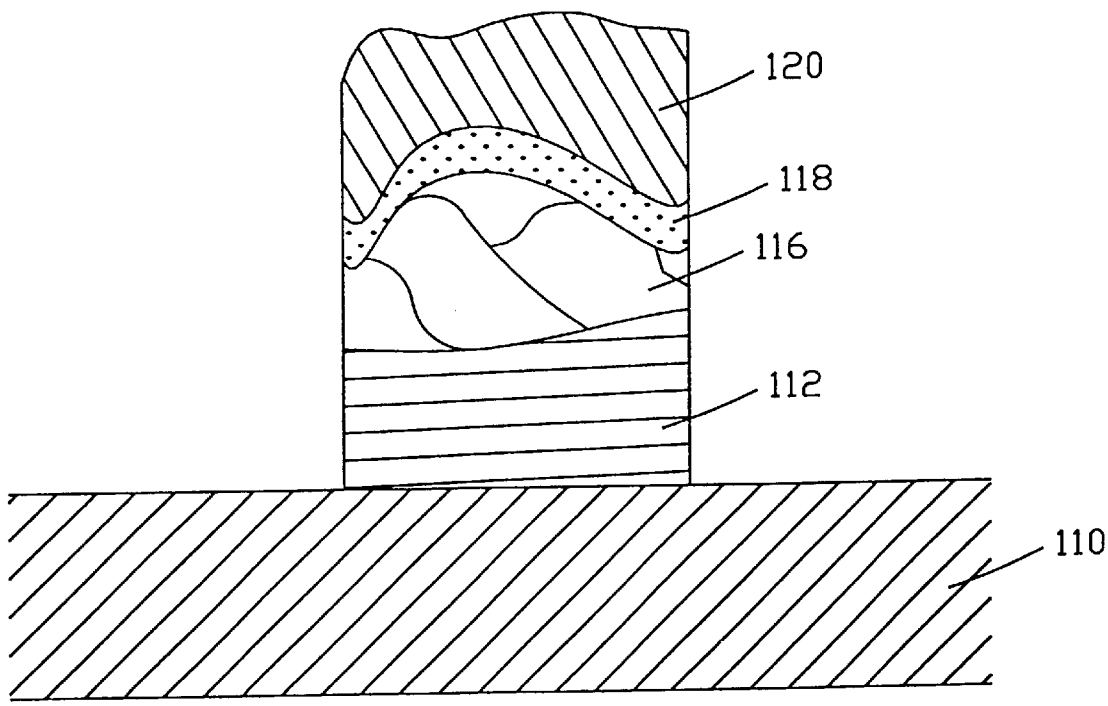
Figure 1D:
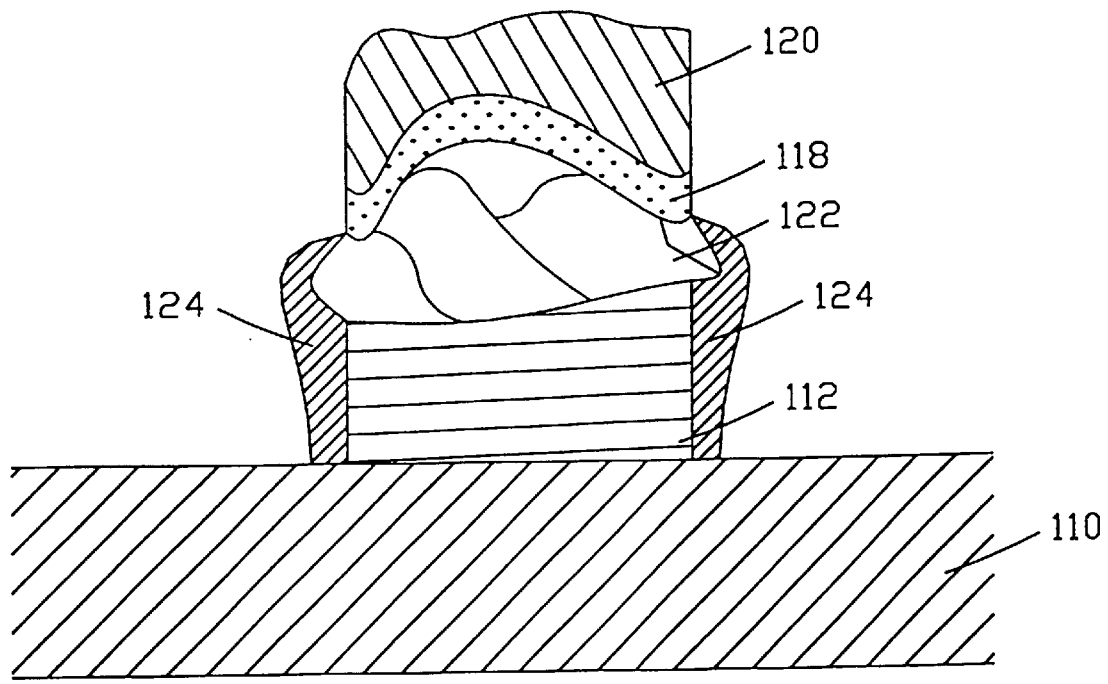
Figure 2A:
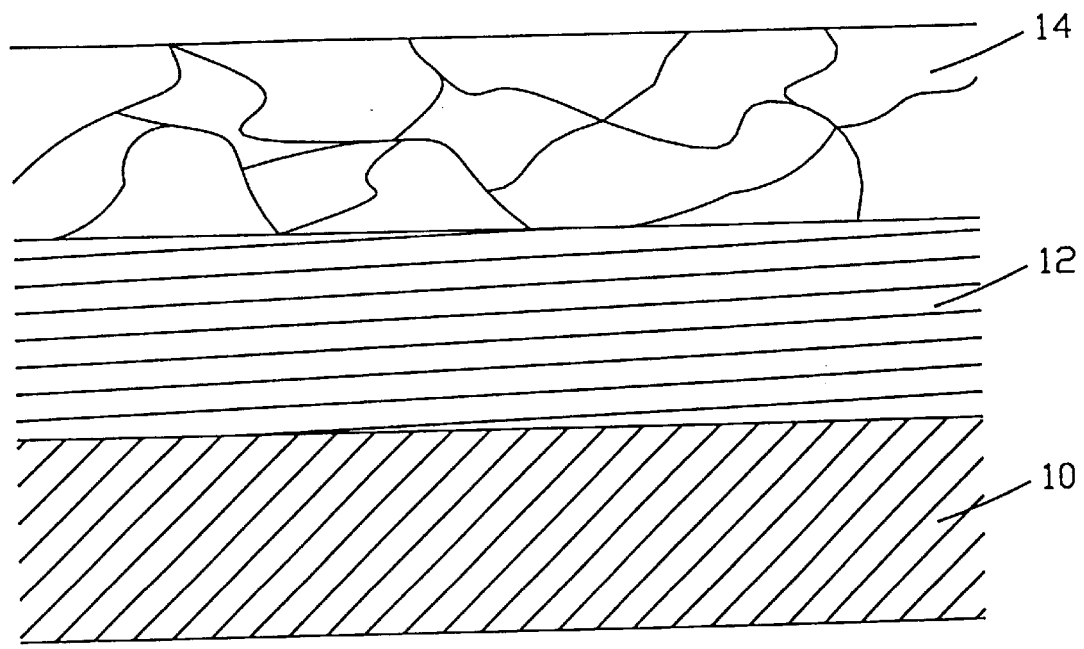
FIG. 2A to FIG. 2F show cross-sectional views illustrative of various stages in the fabrication of a poly gate with one embodiment of the present invention.

Referring to FIG. 2A, first, a dielectric layer 10 is formed over a semiconductor substrate, where the dielectric layer 10 comprises silicon oxide layer. Then a polysilicon layer 12 is formed over the dielectric layer 10 and a metal silicide layer 14 is formed over the polysilicon layer 12, where the metal silicide layer 14 comprises tungsten silicide layer. Further, dielectric layer 10, polysilicon layer 12 and metal silicide layers 14 could be planarized before following processes.

Figure 2B:
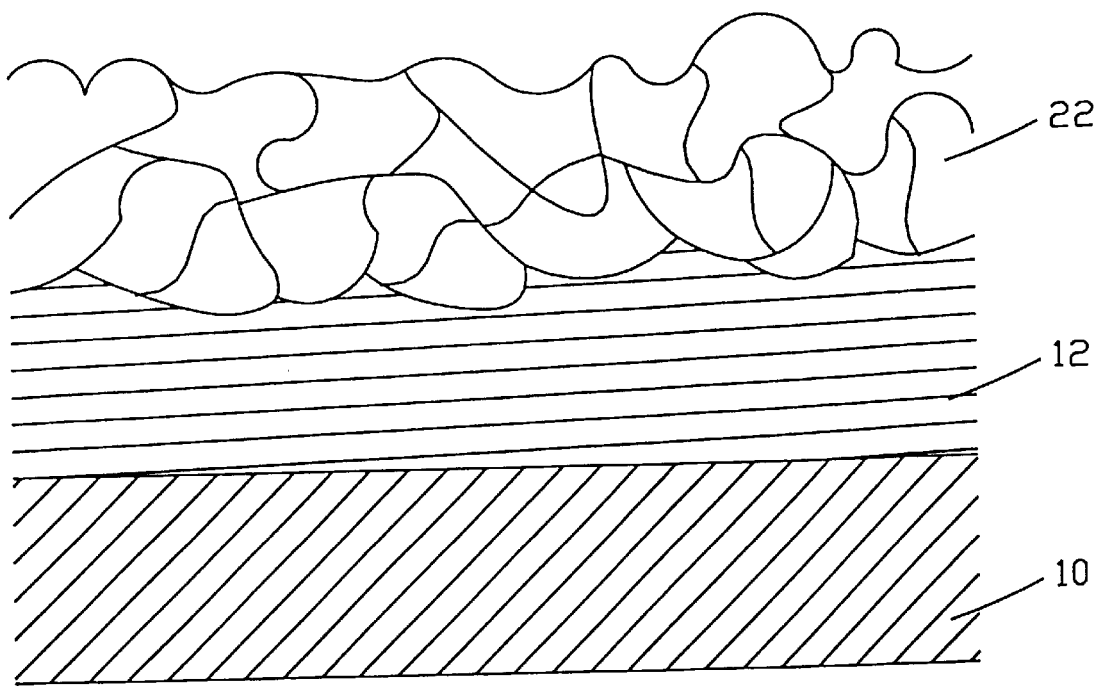

Therefore, an annealing process is used to preanneal the metal silicide layer 14 before any further treatment of the poly gate. The annealing time should be long enough and the annealing temperature should be high enough, such that after the annealing process the original structure of metal silicide layer 14 is completely phase transformed to a new original structure 22 as shown in FIG. 2B. Moreover, there is no phase transformation will occur during following steps of the fabrication of the poly gate. In addition, to prevent high temperature abnormal grain growth, rapid thermal process could be used to decrease the annealing time and prevent abnormal grain growth.

Figure 2C:
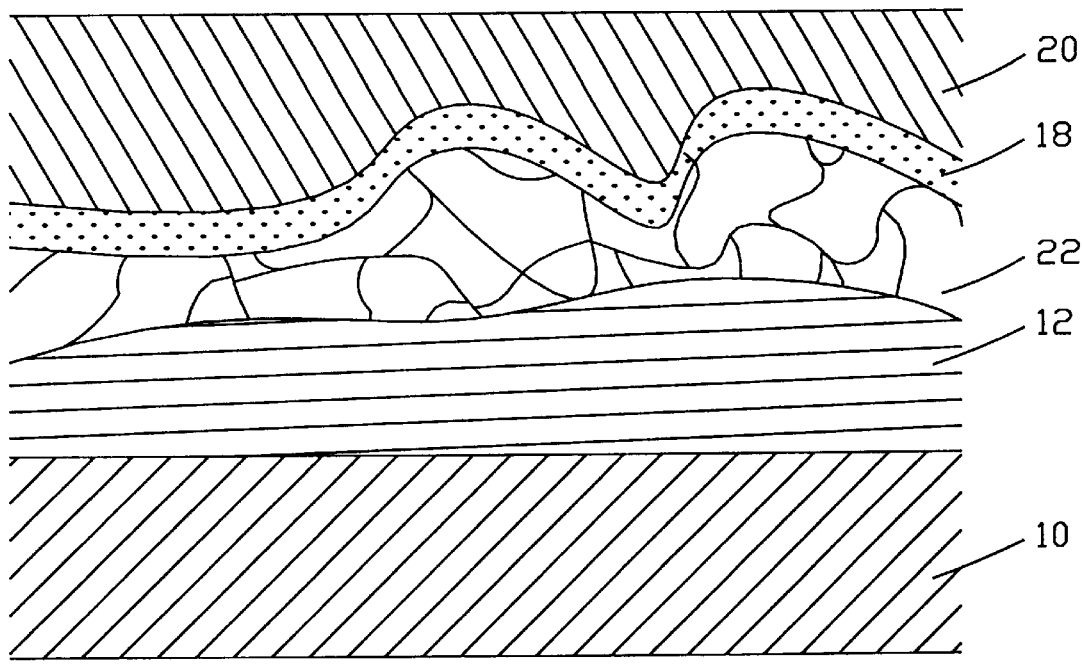

Referring to FIG. 2C, a passivation layer 20 is formed over the metal silicide layer 22. In general, the passivation layer 20 is formed by chemical vapor deposition method so the formation of passivation layer 20 is a high temperature process, as the passivation layer 20 is a silicon nitride layer the typical reacting temperature is about 750° C. No matter how, the preannealing of metal silicide in previous process prevents any change of metal silicide layer structure 22. Thus, there is no any nodule on the surface of passivation layer 20 by the transfiguration of metal silicide layer structure 22. Moreover, an anti-reflection layer 18 could be formed over the metal silicide layer 22 before passivation layer is 20 formed and used in following process.

Figure 2D:
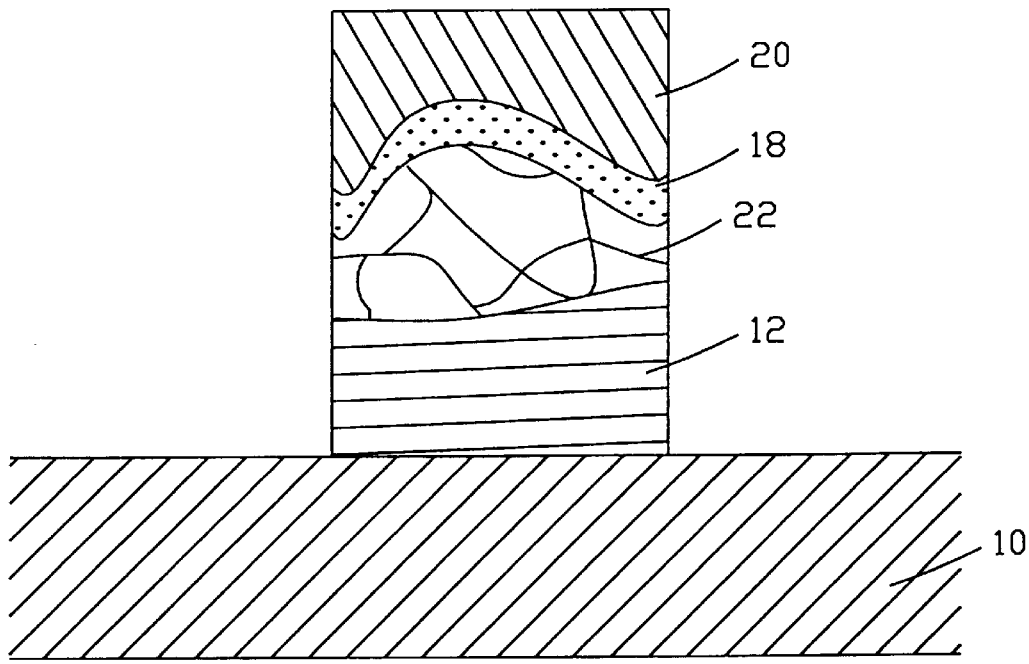

As shown in FIG. 2D, conventional photolithography processes is used to form the primary structure of the poly gate, that comprises polysilicon layer 12, metal silicide layer 22 and passivation layer 20. Photoresist layer is formed over the passivation layer 20 and used to define the poly gate region. In order to form sharp edge, anisotropically etch process is used to form the poly gate by using photoresist layer as mask. An additional advantage of anisotropically etch is the etching scar on the surface of poly gate is reduced by the uniform direction of etching process, so the damage on surface is slight. Further, in order to decrease the quantity of reflection and improve the photo resolution, an anti-reflection layer 18 over the metal silicide layer 22 could be used. The anti-reflection layer is formed before passivation layer is 20 formed.

Figure 2E:
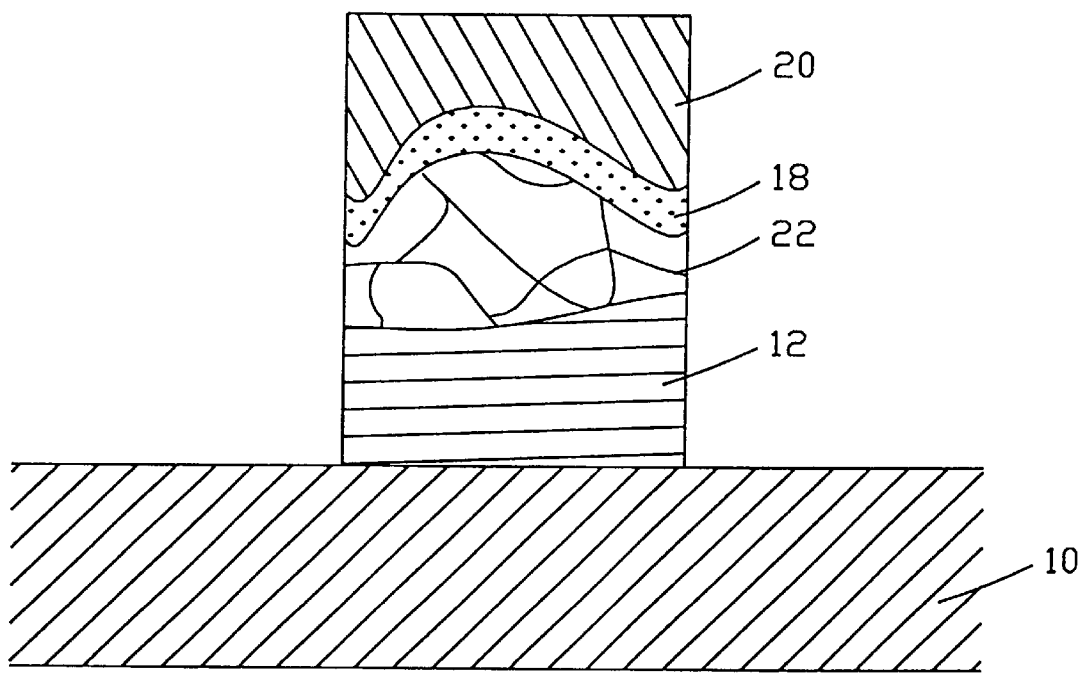

Referring to FIG. 2E, gate etch anneal is used to repair these scars on the surface of the poly gate, where the gate etch anneal process also is a high temperature process and a typical temperature is about 850° C. During the annealing process, these scars vanish by the reformation of polysilicon layer 12 and passivation layer 20 on the surface of poly gate. No matter how, the preannealing of metal silicide layer 22 in previous process absolutely prevents any phase transition of metal silicide layer 22 again. Thus, the surface of metal silicide layer 22 will not be changed and these is no extrusion is formed on the sidewall of poly gate, wherein the extrusion is the mainly disadvantage of known fabrication of poly gate.

Figure 2F:
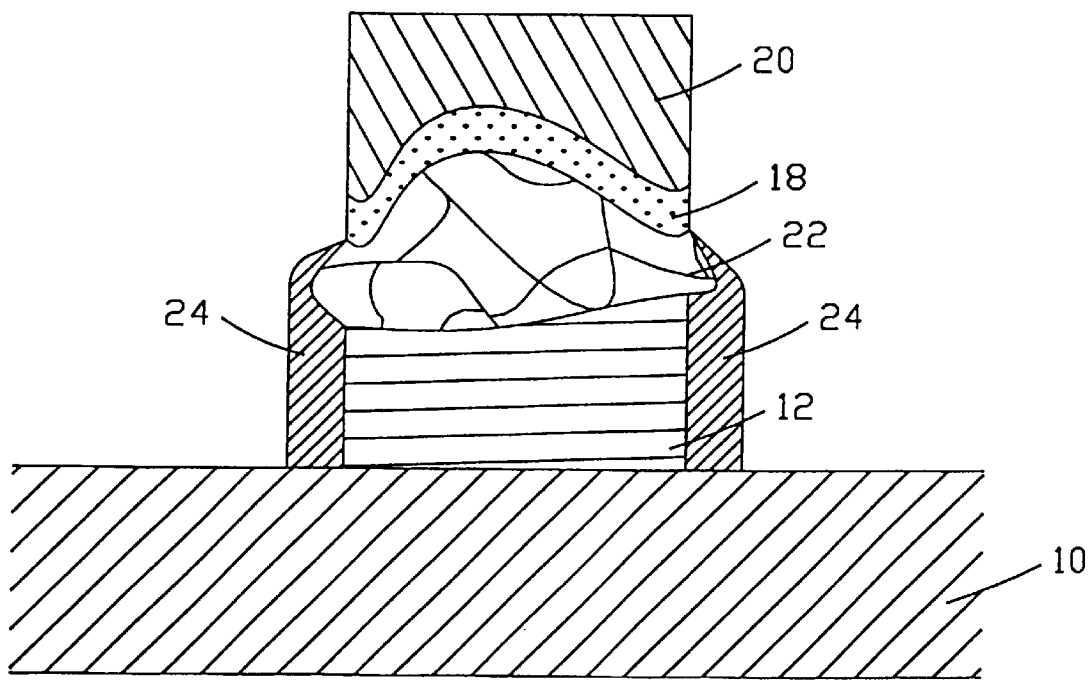

Finally, a sidewall oxide 24 is formed as FIG. 2F shows. As usual, the sidewall oxide 24 is provided by rapid thermal oxidation process and typical temperature is about 1000° C. to 1100° C. Because these is no phase transformation occurs during the gate etch anneal, the surface of the sidewall of poly gate is smooth. Then the sidewall oxide 24 also is smooth and there is no peeling and cracking problems.

In another embodiment of the invention, a poly gate structure of a dynamic random access memory is provided. The mainly details of the embodiment are similar to the previous embodiment except following difference. First, the dielectric layer 10 is a silicon layer and the metal silicide layer 14 is a tungsten silicide layer. Second, the substrate comprises dynamic random access memory and the poly gate is used to form the gate structure of metal-oxide-semiconductor of DRAM. Third, the passivation layer 20 is a silicon nitride layer and a silicon oxidant nitride layer is used to be the anti-reflection layer 18. Fourth, the tungsten silicide layer is formed by chemical vapor deposition method and silane is replaced by dichlorosilance to improve the quality of tungsten silicide layer. Fifth, The annealing of metal silicide 14 completely transform the tungsten structure from hexagonal structure to tetragonal structure, and the final grain size after the phase transformation is about 800 angstroms. As usually, the annealing is performed by rapid thermal process or in tube. By the former, the annealing temperature is about 1000° C. and annealing time is about 120 seconds; by the later, the annealing time is about 30 minutes and the annealing temperature is about 800° C.

Although specific embodiments have been illustrated and described, it will be obvious to those skilled in the art that various modifications may be made without departing from what is intended to be limited solely by the appended claims.

What is claimed is:

1. A method for forming a poly gate structures comprising steps of:

provide a semiconductor substrate;

forming a dielectric layer over said semiconductor substrate;

forming a polysilicon layer over said dielectric layer;

forming a metal silicide layer over said polysilicon layer;

annealing said metal silicide layer, whereby said annealing let structure of said metal silicide layer transform to a stable structure that no phase transition happens during subsequent step;

forming a passivation layer over said metal silicide layer;

forming and patterning a photoresist layer on said passivation layer, said photoresist layer defining a poly gate region over said passivation layer;

anisotropically etching portions of said polysilicon layer, said metal silicide layer and said passivation layer to form said poly gate using said photoresist layer as a mask, thereby exposing said dielectric layer;

removing said photoresist layer;

annealing said poly gate; and forming a smooth sidewall oxide on sidewall of said poly gate.

2. The method according to claim 1, wherein said dielectric layer comprises silicon oxide layer.

3. The method according to claim 1, wherein said metal silicide layer comprises tungsten silicide layer.

4. The method according to claim 1, wherein said passivation layer comprises silicon nitride layer.

5. A method of forming a poly gate structure comprising steps of:

providing a semiconductor substrate;

forming a dielectric layer over said semiconductor substrate;

planarizing said dielectric layer;

forming a polysilicon layer over said dielectric layer;

forming a metal silicide layer over said polysilicon layer;

annealing said metal silicide layer;

forming a passivation layer over said metal silicide layer;

forming and patterning a photoresist layer on said passivation layer, said photoresist layer defining a poly gate region over said passivation layer;

anisotropically etching portions of said polysilicon layer, said metal silicide layer and said passivation layer to form said poly gate using said photoresist layer as a mask, thereby exposing said dielectric layer;

removing said photoresist layer;

planarizing said passivation layer;

annealing said poly gate; and forming a smooth sidewall oxide on sidewall of said poly gate.

6. The method according to claim 1, further comprising forming an anti-reflection layer over said metal silicide layer before forming said passivation layer, wherein said anti-reflection layer is applied to repress anti-reflection and increase photo resolution.

7. The method according to claim 6, wherein said anti-refection layer comprising silicon oxidant nitride layer.

8. The method according to claim 1, wherein said annealing said metal silicide layer is used to prevent any phase transition of said metal silicide which occurs during any further treatment of said poly gate.

9. The method according to claim 8, wherein said further treatment of said poly gate comprises a gate etch anneal and a silicon nitride deposition.

10. The method according to claim 8, wherein said annealing said metal silicide layer is performed in an annealing condition, said annealing condition comprises annealing time and annealing temperature.

11. The method according to claim 10, wherein said annealing condition is decided by a plurality of factors, compressing said metal silicide layer, said further treatment.

12. A method for forming a poly gate structure of a dynamic random access memory, wherein said method comprising:

providing a semiconductor substrate;

forming a silicon oxide layer over said semiconductor substrate;

forming a polysilicon layer over said silicon oxide layer;

depositing a tungsten silicide layer over said polysilicon layer;

annealing said tungsten silicide layer by a rapid thermal process chamber, wherein annealing time is about 120 seconds and annealing temperature is about 1000° C., whereby said annealing let structure of said metal silicide layer transform to a stable structure that no phase transition happens during subsequent step;

forming and patterning a photoresist layer on said passivation layer, said photoresist layer defining a poly gate region over said passivation layer;

anisotropically etching portions of said polysilicon layer, said tungsten silicide layer and said passivation layer to form said poly gate using said photoresist layer as a mask, thereby exposing said dielectric layer;

removing said photoresist layer;

annealing said poly gate; and forming a smooth sidewall oxide on sidewall of said poly gate.

13. The method according to claim 12, further comprising planarizing said silicon oxide layer.

14. The method according to claim 12, wherein said annealing tungsten silicide layer completely changes said deposited tungsten silicide structure from hexagonal structure to tetragonal structure, and phase transformation temperature depends on ratio of tungsten to silicide.

15. The method according to claim 12, wherein said annealing tungsten silicide layer should be applied before any further treatment of said poly gate.

16. The method according to claim 15, wherein said further treatment comprises a gate etch annealing and a silicon nitride deposition.

* * * * *